United States Patent [19]
Harris et al.

[11] Patent Number: 5,450,132
[45] Date of Patent: Sep. 12, 1995

[54] METHOD AND APPARATUS FOR DATA COMPRESSION WITH REDUCED DISTORTION

[75] Inventors: Richard W. Harris, Logan; Paul D. Israelsen; Scott E. Budge, both of North Logan, all of Utah

[73] Assignee: Utah State University Foundation, Logan, Utah

[21] Appl. No.: 180,010

[22] Filed: Jan. 11, 1994

Related U.S. Application Data

[63] Continuation of Ser. No. 676,460, Mar. 26, 1991, abandoned, which is a continuation of Ser. No. 365,940, Jun. 13, 1989, abandoned.

[51] Int. Cl.$^6$ .............................................. H04N 7/13
[52] U.S. Cl. ..................................... 348/418; 348/419
[58] Field of Search ............................. 348/418, 419; H04N 7/13

[56] References Cited

U.S. PATENT DOCUMENTS

| | | | |
|---|---|---|---|
| 4,772,946 | 9/1988 | Hammer | 358/133 |
| 4,903,317 | 2/1990 | Nishihara et al. | 358/426 X |
| 4,933,762 | 6/1990 | Guichard et al. | 358/133 |
| 4,943,855 | 7/1990 | Bheda et al. | 358/133 |

OTHER PUBLICATIONS

Baker, R. L., "Vector Quantization of Digital Images" Doctoral Thesis, Stanford University (1984).
Jones, D. W., "Application of Splayed Trees to Data Compression Communications of the ACM", vol. 31, No. 8, pp. 996–1007 (Aug. 1988).
Storer, J. A., "Data Compression: Methods and Theory", Computer Science Press, pp. 39–128 (1988).
Ziv, J. and Lempel, A., "A Universal Algorithm for Sequential Data Compression", IEEE Transactions on Information Theory, pp. 337–343 (Jun. 1976).
Ziv, J., "On Universal Quantization", IEEE Transactions on Information Theory, vol. IT–31, No. 3 (May 1985).

*Primary Examiner*—Victor R. Kostak
*Attorney, Agent, or Firm*—Venable, Baetjer, Howard & Civiletti

[57] ABSTRACT

Apparatus for compressing data is disclosed in which input data is compressed by a vector quantization process and decoded by the vector quantization process. The input data and the decoded input data are compared and a difference signal as produced. A portion of the difference signal is preferably losslessly compressed and transmitted with the vector quantized input signal to a decoder over a communication channel. The decoder decodes the vector quantized portion of the signal and the compressed difference signal for reconstructing the input signal with an error which is less than that which would result from uncompensated vector quantization.

20 Claims, 2 Drawing Sheets

METHOD AND APPARATUS FOR DATA COMPRESSION WITH REDUCED DISTORTION

This application is a continuation of application Ser. No. 676,460, filed Mar. 26, 1991, now abandoned, which is a continuation of application Ser. No. 365,940, filed Jun. 13, 1989, now abandoned.

BACKGROUND OF THE INVENTION

The invention relates generally to data compression. More specifically, the invention relates to a method and apparatus for compressing image data utilizing an encoding technique which results in reduced distortion or error in the data.

Numerous fields of endeavor make use of vector quantization processing. One newly emerging application is data compression. The preferred embodiment of the invention will be described with particular reference to compression of image signals, though such an illustration is not a limitation on its scope.

A quantizer is a device which represents one signal which can take on a large number of values by another signal which can take on only a limited number of values. A four bit analog-to-digital converter, for example, represents the value of a continuously varying (i.e., analog) signal by a digital signal which can have only one of sixteen values. Scaler quantizers operate on signals having a single degree of freedom, such as an analog-to-digital converter operating on a voltage signal. Vector quantizers operate on signals having multiple degrees of freedom as will be discussed more fully below.

A vector quantizer for compressing video images conceptually divides the image into numerous small areas called pixels (a term formed from the words "picture" and "element"). Pixels are sufficiently small that the intensity of the image is approximately constant across the pixel area. For example, a black and white image of a house might be divided into a grid of 600 rows and 600 pixels per row. Each pixel would be like a small dot in the image. A group of pixels together would form a vector which can be thought of as a small subimage. For example a 6×6 square patch of pixels forms a vector which may be a portion of a shadow, or part of the roof line against a light background. Vectors formed from an image shall be called image vectors. The present invention operates on vectors which, for the illustrated example, are image vectors. In general, any source of vector signals may be used, and vectors which are subject to quantization are more generally referred to as input vectors.

While a black and white image serves as an example here, vectors might also be formed from red, green, or blue levels from a color image. They might also be formed from Y,I and Q components of a color image, or from transform coefficients of an image signal on which a Hadamard, Fourier, or other transform has operated.

Numerous methods exist for manipulating an image to form image vectors. For example, a television camera might generate an analog video signal in a raster scan format having 600 scan lines per frame. An analog-to-digital converter could then digitize the video signal at a sampling rate of 600 samples per scan line. Digital signal processing equipment can then store the digital samples, and group them into vectors. The process of digitizing an analog video signal is a form of scaler quantization which is similar to but distinct from methods of vector quantization. The discussion which follows assumes that one of many methods well known in the art of signal processing can be used to produce input digital image signals.

Before quantizing an image, a vector quantizer stores a set of "codebook" vectors in memory. Codebook vectors are vectors which are chosen to be representative of commonly found image vectors. The quantizer stores a sufficient variety of codebook vectors so that at least one closely matches each of the many vectors that might be found in the full image. Each codebook vector is assigned a unique identification code. The set of all codebook vectors is called a codebook.

In practice, the identification code for a codebook vector may be an address in a memory which stores the vector values. The precise order of the entries may be arbitrary, or it may be selected according to some property of the vectors.

When quantizing a full image, a vector quantizer divides the full image into a series of image vectors. For each image vector, the vector quantizer identifies one closely matching codebook vector. The vector quantizer then generates a new signal made up of the series of the identification codes of the selected codebook entries.

Regeneration of the full image can be accomplished by a device which has the complete codebook stored in memory. The device regenerates the image signal by replacing each ID code in the quantized signal with its corresponding codebook vector. The regenerated image differs from the original image, because codebook entries do not precisely match the original image vectors. The difference is called distortion or loss. Some forms of compression result in little or no loss. In effect, the input signal is changed in form but not in quality. While such compression techniques may not significantly affect or reduce bandwidth or processing time, other advantages such as improved signal quality or equipment compatibility may result. However, when system constraints exist, it may be necessary to suffer a certain level of distortion. The amount of such distortion which is tolerable depends, in part, on whether it is noticeable. In video transmission systems for example, the viewer may be the best judge of whether the distortion is in fact acceptable. Some vector quantizer systems have produced acceptable distortion with conventional video formats (i.e. 512×512 pixels). High definition television (HDTV) however has approximately 5 times the data of conventional TV formats. Accordingly compression techniques which produce tolerable distortion levels for conventional television may not work with HDTV. Also, if bandwidth requirements can be reduced without loss of picture quality, channel capacity may be increased.

SUMMARY OF THE INVENTION

The present invention comprises a method and apparatus for compressing an input signal with reduced distortion. A vector quantizer responsive to the input signal produces a vector quantized signal representative of an approximation of the input signal. A decoder responsive to the vector quantizer signal produces a replica of the input signal which has a distortion resulting from such vector quantization equal to the difference between the input and replica. In a preferred embodiment a lossless compressor responsive to the difference, losslessly encodes a selected significant portion of said difference. A decoder responsive to the vector quantized signal and the encoded portion of the difference produces an output signal different from the input by an amount less than the distortion resulting from vector quantization.

DETAILED DESCRIPTION OF THE PREFERRED EMBODIMENT

Figure 1:
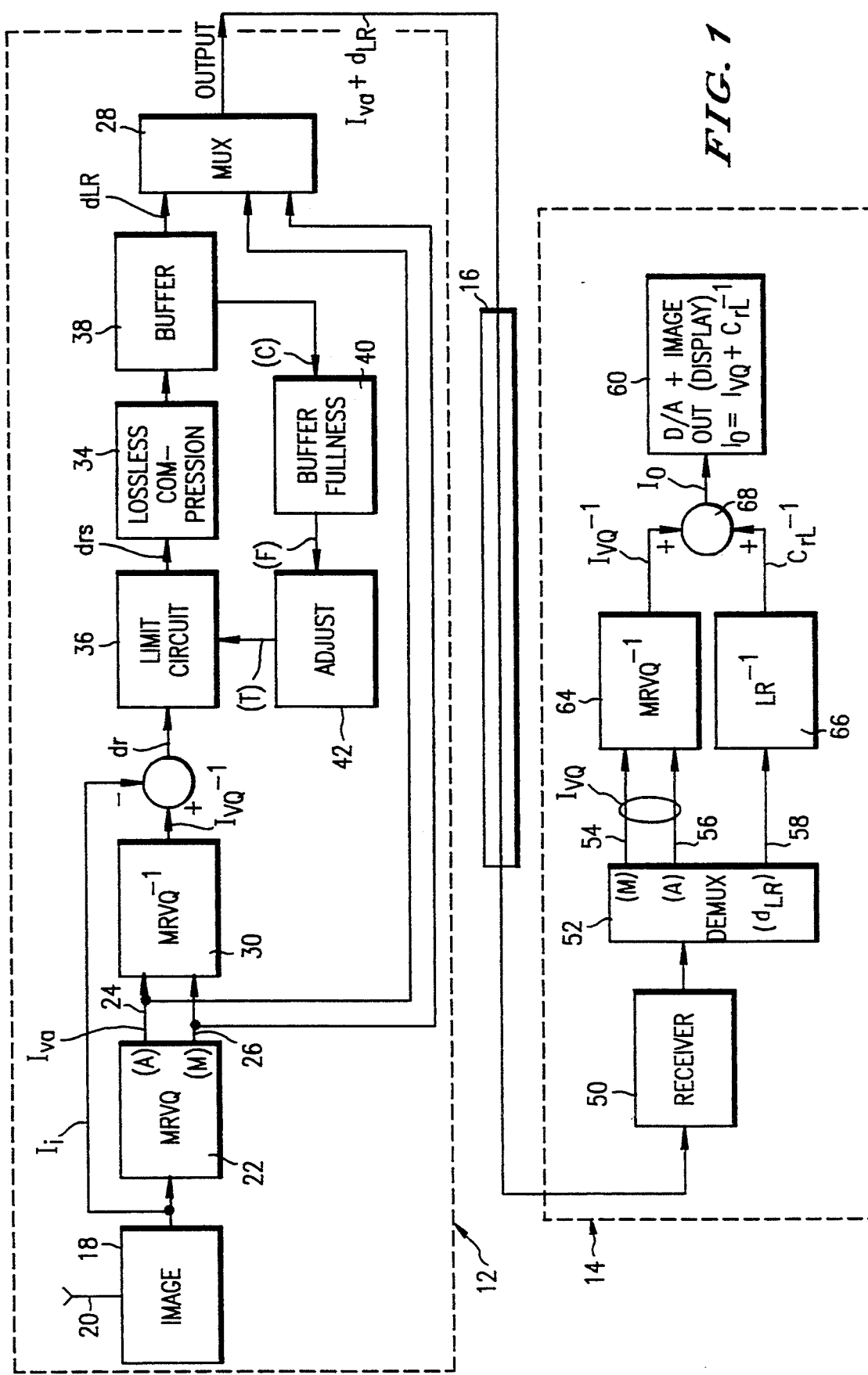
FIG. 1 is a schematic block diagram of the apparatus for compressing data with reduced distortion according to the present invention.

The discussion which follows makes use of mathematical concepts and notations from the field of vector algebra. Such notations provide precise and widely understood terms which are best suited to disclosing the operation of the invention.

TERMS & NOTATIONS

Scalar: A single value. Scalars are denoted by lower case letters (sometimes with subscripts). For example, a scalar may be designated as "a" or as "$a_1$".

Vector: An ordered set of scalars. Vectors are denoted by upper case letters (sometimes with subscripts). For example, a vector may be designated as "A" or "$A_1$". The dimension of a vector is the number of scalar elements in the ordered set. Vectors may also be denoted by listing its scalars in brackets. For example, a two dimensional vector may be designated as "$\{a_1, a_2\}$". A set of vectors shall be designated by an underlined capital letter. For example, a set of codebook vectors may be designated as S.

Mean: A scaler which is the average of the scaler value of a vector divided by the number n of vector elements.

$$\overline{A} = \sum_{1}^{n} a_{1-n}/n$$

Address: Identification code for a codebook entry.

Norm: A scalar which is a measure of the magnitude of the vector. The norm of a vector shall be denoted by an upper case letter (which designates the vector) between vertical bars. For example, for a vector $A = \{a_1, a_2\}$, the norm of A is a scaler $h_a$ i.e., $$|A| = h_a$$

Unless otherwise noted, the norm of a vector may be calculated as sum of the absolute values of the scalar values of a vector, e.g.:

$$|A| = h_a = |a_1| + |a_2|.$$

Vector Sum: A vector sum is itself a vector whose scalar elements are the sum of the corresponding elements of two vectors. For example, for two vectors $A = \{a_1, a_2\}$ and $B = \{b_1, b_2\}$ the sum of A and B is a vector C, i.e.:

$$A + B = C = \{c_1, c_2\} = \{(a_1 + b_1), (a_2 + b_2)\}.$$

Vector Difference: A vector whose scalar elements are the differences of the corresponding elements of the two vectors. For example, for two vectors $A = \{a_1, a_2\}$ and $B = \{b_1, b_2\}$ the difference between A and B is a vector E, i.e.:

$$A - B = E = \{e_1, e_2\} = \{(a_1 - b_1), (a_2 - b_2)\}.$$

Distance: A scalar which is the norm of the vector difference between the two vectors. Distance shall be denoted by the small case letter d followed by two vectors in parenthesis. For example, for two vectors $A = \{a_1, a_2\}$ and $B = \{b_1, b_2\}$, the distance between A and B shall be a scalar h written as:

$$d(A,B) = h_{A,B} = |A - B|$$

For the purpose of this discussion, the norm is taken as the sum of the absolute values of the scalar elements of the distance vectors. Written another way:

$$d(A,B) = h_{A,B} = |A - B| = |(a_1 - b_1)| + |(a_2 - b_2)|.$$

The distance might alternatively be one of the well known Euclidenn Norms, such as square root of the sum of the squares of the differences of the scalar elements of the vectors. Written another way:

$$d(A,B) = h_{A,B} = \sqrt{(a_1 - b_1)^2 + (a_2 - b_2)^2}$$

The following definitions are also included here for convenience.

Codebook Vector: A vector which is representative of a region of a vector space.

Input Vector: A vector which serves as input data to a vector quantizer.

Image Vector: A vector formed from image data.

Measure: An operator which provides a unit of comparison, e.g. distance or magnitude.

Representative Element: An element of a set which is representative of a subset of elements from the set (e.g. a codebook vector is representative of a subset of all possible vectors).

Input Element: An element which serves as an input to a processor which matches the input element to a representative element (e.g. an input vector is an input to a vector quantizer).

THE SEARCH METHOD

In accordance with a preferred embodiment of the present invention, input data in digital form is subjected to a vector quantization process developed by Richard Baker and published in June, 1984 in his PhD. Dissertation entitled "Vector Quantization of Digital Images" at Stanford University. Baker's algorithm known as Mean Residual Vector Quantization quantizes or compresses an input data stream.

The codebook set may be designed in accordance with an article by Buzo and Gray entitled "An Algorithm for Vector Quantizer Design", IEEE Transactions On Communications, Vol. Com.-28, No. 1 (Jan. 1980). Thereafter, the vectors from the codebook are searched in order to map the input vector with the closest codebook vector. In order to reduce distortion or error various search techniques have been developed to find the best match. One very accurate and fast technique is disclosed in copending patent application of Bi et al entitled "A Full Search—Equivalent Method For Matching Data And A Vector Quantizer Utilizing Such Method", filed Jun. 9, 1989, and assigned to Utah State University Foundation, the assignee herein, the search technique disclosed in Bi et al employs the following steps:

1) compute a norm or other characteristic measure of the input vector I,
2) identify a reference codebook vector $A_j$ having a norm which is closest to the norm of the input vector I,
3) compute the distance $h_{I,j}$ between the input vector I and the reference codebook vector $A_j$,
4) identify a subset S of the codebook vectors made up of codebook vectors having a norm in the range $|I| - h_{I,j}$ to $|I| + h_{I,j}$.
5) search the subset S for the codebook vector having the smallest distance to the input vector.
6) select the codebook vector having the smallest distance to the input vector.

In all such search methods there is a difference between the input vector and the codebook vector because codebooks have less information and all possible input vectors. For example in the Bi et al search method described above, the distance between the vectors is a measure of distortion. For purposes of images, other norms (i.e., other measures of distortion) can be defined. Typically distortion can be reduced by increasing the accuracy of the search method so that the best codebook vector is selected. Accuracy can also be increased by adding more codebook vectors to the table. These techniques increase processing time and bandwidth requirements which is often undesirable and counterproductive. Also once the vector quantized signal is transmitted it is not possible to accurately correct for distortion. In accordance with the present invention, distortion is accurately characterized prior to transmission, and the most significant distortion information is transmitted with the vector quantized signal so that the image can be reassembled with reduced distortion.

SYSTEM DESCRIPTION

FIG. 1 is a block diagram of a statistically lossless compression system 10 according to the present invention. Statistically lossless may be defined as a non zero loss which is not perceptible at the desired resolution. The system 10 includes an encoder/transmitter 12 for encoding and transmitting a data stream and a decoder/receiver 14 responsive to the encoder 12 over a channel 16 for receiving and decoding and reassembling the data stream with reduced distortion. The encoder 12 includes an image input 18 which receives an analog input via input channel 20. In the preferred embodiment the analog input is a video signal. Image input 18 converts the analog signal to an input vector $I_i$. A mean residual vector quantizer (MRVQ) 22 vector quantizes the input vector $I_i$. The MRVQ may be operable in accordance with the algorithm described in Baker's paper and the Bi et al patent application referred to above. Also, a preferred circuit for searching the codebook in the MRVQ is described in the patent application of Paul D. Israelsen entitled "Vector Quantizer Codebook Processing Circuit", Ser. No. 333,976 filed Apr. 6, 1989 and assigned to the Utah State University Foundation, the assignee herein. The MRVQ 22 has a table of codebook vectors stored therein. The vector input $I_i$ is encoded as an address representative of the location in memory of the stored codebook vector selected in accordance with the Bi et al search method. The MRVQ also produces a mean which is the average of the scalar of values of the codebook vector divided by the number of elements. The mean normalizes the codebook vectors thereby reducing the size of the codebook and thus the storage requirements. Address output 24 and mean output 26 of MRVQ 22 are coupled to the output multiplexer 28, as shown, for transmission to the receiver 14 over the channel 16 described hereinafter. The combined address 24 and mean 26 are sometimes referred to as the vector quantized input signal $I_{vq}$. The address and means outputs 24, 26 of MRVQ 22 are also coupled to an inverse mean residual vector quantizer (MRVQ$^{-1}$) 30 which is a decoder having stored therein a table of codebook vectors identical to and at the same addresses that are stored in MRVQ 22. The MRVQ$^{-1}$ decodes the vector quantized signal $I_{vq}$ to produce an inverse input vector $I_{vq}^{-1}$, which is an approximation of the input vector I produced by the image input 18. Inverse input vector $I_{vq}^{-1}$ has some associated measurable residual distortion or error $d_r$ in accordance with the following expression:

$$I_i = I_{vq}^{-1} + d_r$$

In prior systems, an inverse MRVQ is typically remotely located for receiving and decoding the MRVQ output to produce a decoded input which is converted to an analog signal for display on cathode ray tube (e.g. Television). In such prior systems, the distortion inherent in the encoded MRVQ signal cannot be readily corrected accurately because the receiver does not have distortion information.

In accordance with the present invention, however, the residual distortion $d_r$ is characterized in the encoder/transmitter 12 prior to transmission of the vector quantized input $I_{vq}$ to the decoder/receiver 14, and a selected significant portion of the residual distortion $d_{rs}$ is communicated to the decoder/receiver 14 so that a correction can be made during reassembly of the input signal.

The residual distortion $d_r$ is measured or characterized by subtracting the inverse image vector $I_{vq}^{-1}$ from the vector input $I_i$ in the summer 32. In a preferred embodiment a portion $d_{rs}$ of the residual distortion $d_r$ produced by the summer 32 is communicated to a lossless compressor circuit 34 via a truncation or limit circuit 36. If desired, it would be possible to use a lossy compressor without departing from the invention.

In accordance with the invention, and for purposes explained hereinafter, the limit circuit 36 selectively limits or truncates the amount of residual distortion data communicated to the compression circuit to the most significant value, namely $d_{rs}$. The lossless compression 34 compresses or encode the truncated distortion data $d_{rs}$ from limit circuit 36 and produces as an output a compressed lossless residual distortion $d_{lr}$. Buffer 38 receives the encoded signal $d_{lr}$ and communicates it to the multiplexer 28 on line 39 as shown.

The buffer 38 has a selected capacity C. A buffer fullness circuit 40 responsive to the state of the buffer 38 produces a fullness signal F indicative of the buffer condition. A limit set circuit 42 responsive to the buffer fullness condition produces a truncation adjustment signal T for the limit circuit 36 so that its output is limited to the most significant residual distortion $d_{rs}$.

It is desirable to transmit data at a maximum uniform rate compatible with the capacity of the transmission medium or other system constraints. Accordingly, the encoder/transmitter 12 controls the amount of data transmitted over channel 16 to the receiver/decoder 14 by adjusting or varying the limit set 42 in accordance with the buffer capacity C. Thus, as the buffer 38 fills to capacity C the limit set 42 is increased to thereby selectively truncate the distortion data. In other words, limit set 42 establishes a threshold at which truncation of the distortion data occurs.

Figure 2:
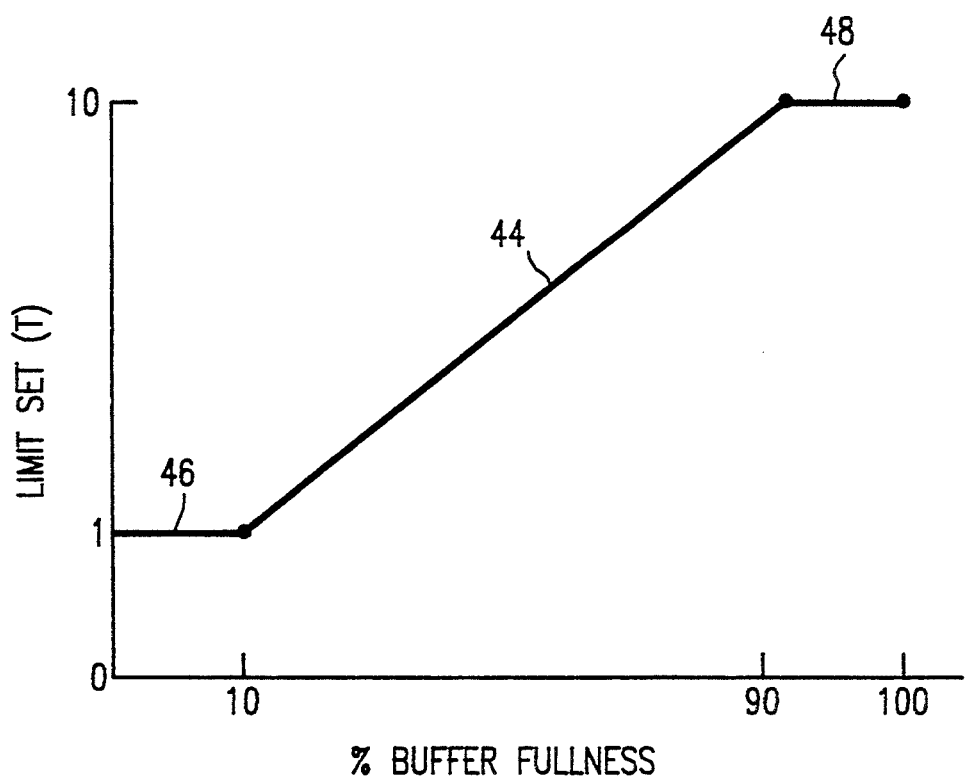
FIG. 2 is a graphic representation of a data input limit as a function of buffer fullness employed in the present invention.

In a preferred embodiment the limit set 42 is varied linearly over a range of buffer fullness values F with end limits at the extremes of buffer fullness. For example, FIG. 2 illustrates graphically a plot of the limit set values T versus buffer fullness F as a percentage of buffer capacity C. The curve 44 varies linearly as shown. At the respective lower and upper extremes 46 and 48 (for example less than 10% C and greater than 90% C) the curve 44 is flat. Thus, the output F of the buffer fullness circuit 40 varies linearly over approximately 80% of the buffer capacity C. However, as can be appreciated from the curve 44, the buffer 38 is not permitted to become empty (0% C) or full (100% C), but instead the curve 44 is constant at the extremes 46, 48. Although the preferred relationship illustrated in FIG. 2 may be varied, if desired, it has been found that a stable maximum data rate from the buffer 38 is achieved by its implementation.

The buffer capacity C is sufficient to allow the encoder/transmitter 12 to transmit data over the channel 16 at a constant data rate. The buffer fullness circuit 40 and truncation adjustment circuit 42 provide negative feedback to limit set circuit 36 so that as the capacity C of buffer 38 is approached, data to the buffer 32 is reduced and vice versa. Further, because the most significant portion of the residual distortion is encoded, an effective mechanism for error compensation results. The most significant residual distortion $d_{rs}$, although truncated or limited, when losslessly compressed or encoded as $d_{lr}$ is useful in correcting or compensating for the most perceptible distortion in the reassembled signal.

The lossless compressor 34 is a device capable of encoding distortion data losslessly (i.e. accurately and without its own error). Known examples of lossless compression techniques include Huffman Coding, Lempel Zev Coding, Splay Tree Coding and Run Length Coding. These forms of compression are accurate. Thus, the significant portion of the residual distortion $d_{rs}$ which is compressed according to any one of such techniques and is substantially error free. The only loss that exists is associated with truncation. Therefore, although some loss occurs, it is controlled in such a way that the encoder/transmitter 12 produces effectively no perceptible loss. Hence, the term statistically lossless encoding is appropriate. For example, it has been found that a conventional color tv picture of 512×512 pixels can be magnified by a factor of eight using the techniques of the present invention without visually perceptible distortion. Thus, eight fold compression can be achieved without perceptable distortion.

DECODER/RECEIVER

The multiplexed signals representing the vector quantized input $I_{vq}$ (address (A) and mean (M)) and the lossless residual $d_{lr}$ are communicated to the decoder/receiver 14 via the communication channel 16. The receiver 50 in the decoder/receiver 14 captures the signals $I_{vq}$ and $d_{lr}$. The multiplexer 52 responsive to the receiver 50 separates the encoded signals and produces corresponding address 54, mean 56 and lossless residual 58 outputs as shown. An inverse mean residual vector quantizer (MRVQ$^{-1}$) 64 (which is identical to MRVQ$^{-1}$ 30 in the encoder/transmitter 12) is coupled to the address (A) and mean (M) outputs 54, 56. MRVQ$^{-1}$ receives and decodes the address and mean in order to produce an inverse vector quantized input $I_{vq}{}^{-1}$ which is identical to the signal produced by MRVQ$^{-1}$ 30 referred to above. Thus the inverse vector quantized signal $I_{vq}{}^{-1}$ in the encoder/transmitter 12 which represents the approximation of the input vector $I_i$ having residual distortion $d_r$ is reproduced in the decoder/receiver 14.

An inverted lossless residual decoder (LR$^{-1}$) 66 receives and decodes the lossless residual output 58 of multiplexer 52 and produces a decoded lossless residual $d_{lr}{}^{-1}$. The inverse vector quantized signal $I_{vq}{}^{-1}$ and the inverse lossless residual $d_{lr}{}^{-1}$ are added in the summer 68 in order to produce an image output signal $I_0$ which may be digital to analog (D/A) converted for display in analog output system 60. The image output $I_0$ is a close representation of the image input $I_i$ with the most significant portion of truncated residual distortion $d_{rs}$ added back in. The decoded image $I_{vq}{}^{-1}$ is a fair representation of the image input $I_i$ but without distortion compensation. The image output $I_o$ has distortion compensation. Thus, the image output $I_o$ is a more accurate representation of the input $I_i$ than the inverse vector quantized input $I_{vq}{}^{-1}$ alone.

The image output $I_o$ more accurately represents the input $I_i$ because an accurate compensating signal (i.e. lossless residual $d_{lr}$) accompanies the vector quantized image signal $I_{vq}$ for reassembly at the decoder/receiver 14. In mathematical terms the relationship between the Input $I_i$ and the output $I_o$ follows:

$$I_i = I_0 - d_{rs}$$

$$I_i = I_{vq}{}^{-1} - d_r$$

$$d_r > d_{rs}$$

$$I_i > I_o > I_{vq}{}^{-1}$$

Thus, the output vector $I_o$ has more information in it concerning the input vector $I_i$ than the inverse vector quantized input $I_{vq}{}^{-1}$. In other words the difference between a decoded vector quantized signal and the original input is greater than the difference between loss compensating output vector and the original input vector. The compensation also is the most significant portion of the error or loss. The system also takes advantage of the maximum bandwidth available by regulating the output from the encoder/transmitter 12 in order to maximize the data rate compatible with the system. The combination of an efficient vector quantizing circuit such as MRVQ 22 with a regulated lossless compressor 34 for transmitting a compensating signal results in statistically lossless system in which distortion is not perceptible at the desired resolution.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. Apparatus for producing an output signal representative of an input signal comprising:
   vector quantizer encoding circuitry responsive to the input signal and operable to generate an encoded input signal approximately representative of said input signal;
   a first signal decoder responsive to the encoded input signal and operable to generate a decoded input signal that is different from the input signal;
   means for compressing a selected portion of said difference signal including means for truncating the difference signal; and
   a second signal decoder responsive to the encoded input signal and the compressed difference signal and operable to generate a decoded output signal that is dissimilar from the input signal by an amount less than the difference signal.

2. Apparatus according to claim 1 wherein the means for truncating the difference signal comprises buffer means having a selected capacity, said buffer responsive to the amount of data in the difference signal, and means responsive to the buffer means for adjusting the amount of data passed to the buffer means so as not exceeded its capacity.

3. Apparatus according to claim 1 wherein said difference signal contains a selected amount of data and the means for compressing a selected portion of the difference signal includes means for producing said difference signal at a relatively uniform data rate.

4. Apparatus according to claim 3 wherein means for producing said difference signal at a relatively uniform data rate comprises:
   a limit circuit responsive to a limit signal for limiting the difference signal, and means responsive to the compressed difference signal for producing said limit signal.

5. Apparatus according to claim 4 wherein said means for producing said limit signal comprises buffer means having a selected capacity and being responsive to the data content of said compressed difference signal and a feedback loop between the buffer and the limit circuit for producing the limit signal.

6. Apparatus according to claim 5 wherein the feedback loop comprises buffer fullness means responsive to the amount of data stored in the buffer for producing a fullness signal and adjustment means responsive for the fullness signal for producing the limit signal.

7. Apparatus according to claim 6 wherein said buffer fullness means comprises means for producing said fullness signal over a major range of buffer capacity.

8. Apparatus according to claim 7 wherein said fullness signal varies linearly over said major range of buffer capacity and further includes invariant minor portions at extremes of said buffer capacity.

9. Apparatus according to claim 8 wherein said major portion of the buffer capacity is between about 10 and 90% and the invariant portions of between 0 and 10% and 90 and 100%, respectively.

10. Apparatus according to claim 1 wherein the first signal decoder comprises inverse vector quantizing means.

11. Apparatus according to claim 10 wherein the second signal decoder comprises inverse vector quantizing means responsive to the encoded input signal and inverse compressing means responsive to the encoded difference signal for producing a decoded difference signal.

12. Apparatus according to claim 11 further comprising summing means responsive to the decoded input signal and the decoded difference signal from the second decoder for producing said decoded output signal.

13. Apparatus according to claim 1 further comprising:
   transmitting means responsive to the encoding means and the compressing means for transmitting the encoded input signal and the compressed difference signal;
   receiving means coupled to the second decoder means for receiving said encoded input signal and said compressed difference signal and coupling the same to the second decoder means; and
   communications means between the transmitter and receiver for carrying said encoded input signal and said difference signal from the transmitting means to the receiving means.

14. Apparatus according to claim 13 wherein said means for compressing the difference signal comprises at least one of the Huffman coding apparatus, Lempel Zev encoding apparatus; Splay Tree encoding apparatus and Run length encoding apparatus.

15. A method for compressing input data comprising the steps of:
   vector quantizing and encoding the input data into an encoded input;
   decoding the encoded input into a decoded input;
   comparing the input data with the decoded input and producing a difference;
   compressing a portion of the difference into an encoded difference and limiting said encoded difference to a relatively constant data rate;
   combining the encoded input and the encoded difference into a compensated encoded form; and
   decoding the compensated encoded form to produce compensated output data which resembles the input data more closely than the decoded input.

16. The method according to claim 15 wherein the step of vector quantizing and encoding the input data comprises mean residual vector quantization.

17. The method according to claim 16 wherein the step of decoding the encoded input comprises inverse vector quantization.

18. The method according to claim 17 wherein the step of decoding the compensated encoded form for producing the compensated output comprises of inverse vector quantization and inverse residual compression.

19. Apparatus for producing compressed data representative of an input signal, comprising:
   an encoder/transmitter system including,
      a first mean residual vector quantizer (MRVQ) connected to an input for mean residual vector quantize encoding an original input signal,
      a first inverse mean residual vector quantizer $(MRVQ)^{-1}$ connected to said first MRVQ for receiving said encoded input signal and producing a lossy decoded input signal therefrom,
      a first signal summing circuit connected to said input and to said first $MRVQ^{-1}$ for receiving said original input and said lossy decoded input signal and producing a residual distortion signal therefrom; and
      a lossless compressor circuit coupled to said first signal summing circuit for producing a lossless compressed residual distortion signal; and
   a receiver/decoder system including a second MRVQ$^{-1}$ for receiving said encoded original input signal and for producing a lossy decoded input signal therefrom, a lossless inverse decoder for receiving said compressed residual distortion signal and producing a lossless decoded distortion signal therefrom, a second signal summer connected to said second inverse vector quantizer and said lossless inverse decoder for receiving said lossless decoded distortion signal and said lossy decoded input signal and for reconstructing said input signal with an error smaller than the residual distortion signal.

20. A method for producing compressed data representative of an input signal, comprising:

mean residual vector quantize (MRVQ) encoding an original input signal;

decoding said MRVQ-encoded input signal to produce a lossy decoded input signal therefrom;

summing said original input signal and said lossy decoded input signal to produce a residual distortion signal therefrom;

compressing said residual distortion signal to produce a lossless compressed residual distortion signal;

transmitting said MRVQ-encoded input signal and compressed residual distortion signal;

receiving said MRVQ-encoded input signal and compressed residual distortion signal;

inverse vector quantizing (MRVQ$^{-1}$) said encoded original input signal to produce a lossy decoded input signal therefrom, decoding said compressed residual distortion signal to produce a lossless decoded distortion signal therefrom, summing said lossy decoded input signal said lossless decoded distortion signal to reconstruct said original input signal with an error smaller than the residual distortion signal.

* * * * *